(12) United States Patent (10) Patent No.: US 7,397,410 B2
Yang (45) Date of Patent: Jul. 8, 2008

(54) INPUT TRACKING HIGH-LEVEL MULTIBIT QUANTIZER FOR DELTA-SIGMA ADC

(75) Inventor: YuQing Yang, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/711,324

(22) Filed: Feb. 27, 2007

(65) Prior Publication Data

US 2008/0055145 A1 Mar. 6, 2008

Related U.S. Application Data

(60) Provisional application No. 60/824,232, filed on Aug. 31, 2006.

(51) Int. Cl.
*H03M 1/12* (2006.01)
(52) U.S. Cl. ....................... 341/156; 341/155
(58) Field of Classification Search .......... 341/130–170
See application file for complete search history.

(56) References Cited

U.S. PATENT DOCUMENTS 6,697,005 B2 * 2/2004 Mulder ....................... 341/156
6,784,818 B2 * 8/2004 Mulder ....................... 341/156
7,256,725 B2 * 8/2007 Mulder ....................... 341/156
7,271,755 B2 * 9/2007 Mulder et al. ............... 341/154

OTHER PUBLICATIONS

"A 3-mW 74-dB SNR 2-Hmz Continuous-Time Delta-Sigma ADC With a Tracking ADC Quantizer in 0.13-μm CMOS" by Lukas Dörrer et al., IEEE Journal of Solid-State Circuits, vol. 40, No. 12, Dec. 2005, pp. 2416-2427.

* cited by examiner

*Primary Examiner*—Lam T Mai
(74) *Attorney, Agent, or Firm*—Wade J. Brady, III; Frederick J. Telecky, Jr.

(57) ABSTRACT

A quantization circuit includes a plurality of resistors, a plurality of tap points, and a plurality of coarse comparators. Each coarse comparator has a first input coupled to an input voltage and a second input coupled to a corresponding coarse tap point voltage. Each coarse comparator operates during a first phase to produce a "1" only if the input voltage exceeds the corresponding coarse tap point voltage. A plurality of fine comparators each have a first input coupled to the input voltage, and each fine comparator operates during a second phase to produce a fine output level indicative of whether the input voltage exceeds a corresponding tap point voltage of a group of tap points located immediately below the tap point connected to the highest coarse comparator producing a "1".

17 Claims, 5 Drawing Sheets

INPUT TRACKING HIGH-LEVEL MULTIBIT QUANTIZER FOR DELTA-SIGMA ADC

CROSS REFERENCE TO RELATED APPLICATION

This application claims the benefit of prior filed now abandoned U.S. provisional application Ser. No. 60/824,232 filed Aug. 31, 2006, entitled "Efficient Digital Controlled Multilevel Quantizer Design for High Performance Sigma-Delta ADC", by YuQing Yang, and incorporated herein by reference.

BACKGROUND OF THE INVENTION

The present invention relates generally to multilevel quantizers, particularly two-phase multilevel quantizers designed to be implemented in reduced amounts of chip area and also designed to dissipate reduced amounts of power. The invention also relates more particularly to high-performance, low-power delta-sigma modulators and delta sigma analog-to-digital converters (ADCs) which include such two-stage multilevel quantizers.

The closest prior art is believed to be represented by the article "A 3-mW 74-dB SNR 2-MHz Continuous-Time Delta-Sigma ADC With a Tracking ADC Quantizer in 0.13-μm CMOS" by Lukas Dörrer et al., IEEE Journal of Solid-State Circuits, Volume 40, Number 12, December 2005, pages 2416-2427. This reference discloses a third-order continuous-time 4-bit delta-sigma ADC, and also discloses reduction of power consumption by using a tracking ADC. The foregoing reference does not disclose interpolation of the quantizer output, and suffers from several major shortcomings. One shortcoming is that the disclosed delta-sigma ADC requires a separate circuit to set up the initial modulator DC operational point. It also requires additional digital to analog converter (DAC) circuits, and suffers from potential modulator instability due to parasitic high frequency input signal leakages and the like. The foregoing reference discloses the common technique of using a simplified first order dynamic element matching (DEM) circuit, but that is insufficient to overcome the above mentioned shortcomings.

FIG. 1 shows a typical multibit delta-sigma modulator 1, which includes a summing element 3 that sums an input signal Vin with a negative feedback signal on conductor 4 and applies the summation result via conductor 5 to the input of a linear loop filter 6. The output 7 of loop filter 6 is applied to the input of a conventional multilevel quantizer 8. The output 9 of multilevel quantizer 8 is applied to the input of a DEM circuit 10. There are several well known DEM circuit topologies which could be used for DEM circuit 10, which functions to remove the effect of mismatch between feedback elements of feedback DAC 12. The output conductors 11 of DEM circuit 10 are coupled to the input of DAC 12, the output of which produces the above mentioned negative feedback signal on conductor 4.

FIG. 2 illustrates a typical flash ADC-based quantizer implementation of multilevel quantizer 8 of FIG. 1. Multilevel quantizer 8 includes, for example, a resistor string 15 which includes 16 equal resistors R-0,1,2 ... 15 connected in series. Tap points 16-0,1 ... 15 are connected to the (−) inputs of 16 comparators 17-0,1 ... 15 as shown. The (+) inputs of comparators 17-0,1 ... 15 are connected to an input signal $V_{Qin}$ produced by loop filter 6. Typically, multilevel quantizer 8 operates according to a thermometer code, and produces output voltages designated as Levels 0,1,2 ... 15 on comparator output conductors 9-0,1,2 ... 15, respectively, as the input signal $V_{Qin}$ is increased from ground voltage to Vref volts. The corresponding thermometer code values, Levels 0,1,2 ... 15, are applied to the inputs of DEM circuit 10.

Multilevel delta-sigma modulator topology is becoming more common because it further reduces quantization noise and because it relaxes certain analog circuit design constraints, such operational amplifier slew requirements and bandwidth requirements of the first integrator stage in the loop filter.

Since a delta-sigma modulator is a feedback system, the quantizer 8 needs to introduce a minimum delay to ensure stability of the system. This minimum delay requirement seriously limits the practical options for the topology of the multilevel quantizer. Flash type ADCs are normally used as quantizers due to their low latency, which refers to time delay between the outputs and inputs thereof. However, it is well-known that flash ADCs are characterized by low efficiency and low resolution. Compared with other ADCs, such as SAR or pipeline ADCs, a flash ADC consumes more power and requires more die area, even though the latency of a flash ADC is lower than the other types. Although increasing quantizer resolution/quantizer levels inside multilevel delta-sigma ADCs reduces output swings (and hence also the power consumption) of the integrators, reduces quantization noise, and decreases performance sensitivity to clock jitter, the low efficiency of conventional flash-based quantizer designs results in excessive power consumption and excessive die area and therefore diminishes the advantages of increased quantizer resolution/quantizer levels of the conventional flash-based quantizers. Conventional flash type quantizers of the type shown in FIG. 2 are considered to be very inefficient and not suitable for many future converter designs.

Thus, there is an unmet need for an improved multilevel quantizer topology which can be implemented in a substantially reduced amount of chip area and which consumes substantially less power than conventional multilevel quantizers, and also provides the advantage of small internal integrator output signal swings.

There also is an unmet need for an improved ADC which can be implemented in a substantially reduced amount of chip area and which consumes substantially less power than ADCs including conventional multilevel quantizers, and also provides the advantage of a small internal signal swing.

There also is an unmet need for an improved quantizer topology which requires simpler control logic circuitry, consumes much lower power, and requires less die area than the prior art flash-based quantizer designs.

SUMMARY OF THE INVENTION

It is an object of the invention to provide an improved multilevel quantizer topology which can be implemented in a substantially reduced amount of chip area and which consumes substantially less power than conventional multilevel quantizers, and also provides the advantage of small internal integrator output signal swings.

It is another object of the invention to provide an improved ADC which can be implemented in a substantially reduced amount of chip area and which consumes substantially less power than ADCs including conventional multilevel quantizers, and also provides the advantage of a small internal signal swing.

It is another object of the invention to provide an improved quantizer topology which requires simpler control logic circuitry, consumes much lower power, and requires less die area than the prior art flash-based quantizer designs.

Briefly described, and in accordance with one embodiment, the present invention provides a quantization circuit which includes a plurality of resistors (R0,1 . . . 15), a plurality of tap points, and a plurality of coarse-resolution comparators (21-3,7,11,15). Each coarse-resolution comparator has a first input coupled to an input voltage ($V_{Qin}$) and a second input coupled to a corresponding coarse-resolution tap point voltage. Each coarse-resolution comparator operates during a first phase to produce a "1" only if the input voltage exceeds the corresponding coarse-resolution tap point voltage. A plurality of fine-resolution comparators (24-1,2,3) each have a first input coupled to the input voltage, and each fine-resolution comparator operates during a second phase to produce a fine-resolution output level indicative of whether the input voltage exceeds a corresponding tap point voltage of a group of tap points located immediately below the tap point connected to the highest coarse-resolution comparator producing a "1".

In one embodiment, the invention provides a conversion circuit including a coarse-resolution quantization circuit (20A) which includes a resistor string (15) including a plurality of resistors (R0,1 . . . 15) and a plurality of tap points between the various resistors, and a plurality of coarse-resolution comparators (21-3,7,11,15), each coarse-resolution comparator having a first input coupled to receive an input voltage ($V_{Qin}$) and a second input coupled to a corresponding coarse-resolution tap point. Each coarse-resolution comparator is operable during a first phase to produce a first logic level only if the input voltage ($V_{Qin}$) exceeds a voltage of the coarse-resolution tap point coupled to the second input of that coarse-resolution comparator. A fine-resolution quantization circuit (20B) includes a plurality of fine-resolution comparators (24-1,2,3) each having a first input coupled to receive the input voltage ($V_{Qin}$), each fine-resolution comparator being operable during a second phase to produce a fine-resolution output logic level indicative of whether the input voltage ($V_{Qin}$) exceeds a voltage of a tap point coupled to a second input of that fine-resolution comparator. A control circuit (28) is operative to selectively couple the second input of each fine-resolution comparator to a corresponding tap point of a group of tap points located immediately below a coarse-resolution tap point coupled to a highest coarse-resolution comparator producing the first logic level. The output logic levels of the fine-resolution comparators and the coarse-resolution comparators up to and including the highest coarse-resolution comparator generating the first logic level represent a thermometer code of a quantized value of the input voltage ($V_{Qin}$).

In one embodiment, a group of tap points is located immediately below each coarse-resolution tap point, respectively, and the control circuit (28) includes a plurality of groups (18A,B,C,D) of switches (S0,1 . . . 14), wherein each group of switches corresponds to a group of the tap points, respectively. In each group of switches, a first terminal of each switch is coupled to a corresponding tap point and a second terminal of that switch is coupled to the second input of a corresponding fine-resolution comparator (24-1, 2, 3), respectively. In a described embodiment, the control circuit (28) includes a plurality of exclusive OR circuits (61A,B,C, D), each exclusive OR circuit having a pair of inputs coupled to outputs of a pair of adjacent coarse-resolution comparators (21-3,7,11,15), respectively, to determine if output logic levels thereof are equal. An output (K1,2,3, or 4) of each exclusive OR circuit is coupled to control electrodes of the switches of a corresponding group (18A,B,C, or D), respectively, to close the switches in that group when the output logic levels of the adjacent coarse-resolution comparators are different.

In a described embodiment, the conversion circuit includes a plurality of interpolation circuits (63A,B,C,D) each having a first pair of inputs coupled to outputs of a pair of adjacent coarse-resolution comparators (21-3,7,11,15), respectively. Each interpolation circuit is coupled to the output of a corresponding exclusive OR circuit (61D,C,B, or A), respectively, to produce a plurality of interpolation quantization levels between quantization levels represented by the outputs of a corresponding pair of adjacent coarse-resolution comparators. The exclusive OR circuits may be exclusive NOR gates.

In a described embodiment, each interpolation circuit (65) includes an AND function circuit (64) for performing a logical ANDing of the output levels of a corresponding pair of adjacent coarse-resolution comparators and a plurality of switch circuits (63). Each switch circuit includes a first switch (66) coupled between an output of the AND function circuit (64) and a corresponding quantization level conductor (70A,B or C), and a second switch (76) coupled between an output ($V_{1LSB}$, $V_{2LSB}$ or $V_{3LSB}$) of a corresponding fine-resolution comparator (24-1,2 or 3) and the corresponding quantization level conductor (70A,B or C). The first switch (66) is operable to couple a logic level equal to the first logic level to the corresponding quantization level conductor (70A,B or C) when output levels of the corresponding pair of adjacent coarse-resolution quantization circuits are equal, and the second switch (76) is operable to couple the output ($V_{1LSB}$, $V_{2LSB}$ or $V_{3LSB}$) of the corresponding fine-resolution comparator (24-1,2 or 3) to the corresponding quantization level conductor (70A,B or C) when the output levels of the corresponding pair of adjacent coarse-resolution quantization circuits are different.

In one embodiment, the conversion includes a delta-sigma modulator (40), and the coarse-resolution quantization circuit (20A) and the fine-resolution quantization circuit (20B) are included to form a two-phase quantizer (20) of the delta-sigma modulator (40). In one embodiment, a decimation filter is coupled to an output of the two-phase quantizer (20) such that the conversion circuit is a delta-sigma ADC.

In one embodiment, the invention provides a method of quantizing an analog input signal ($V_{Qin}$), including, during a first phase time, coupling a first input of each of a plurality of coarse-resolution comparators (21-3,7,11,15) to the input voltage ($V_{Qin}$), wherein a second input of each coarse-resolution comparator is coupled to a plurality of corresponding coarse tap points, respectively, of a resistor string which also includes a plurality of intermediate tap points to cause each coarse-resolution comparator to produce a first logic level only if the input voltage ($V_{Qin}$) exceeds a voltage of the coarse-resolution tap point coupled to the first input of that course-resolution comparator. During a second phase time which follows the first phase time, a first input of each of a plurality of fine-resolution comparators (24-1,2,3) is coupled to the input voltage ($V_{Qin}$), and a second input of each fine-resolution comparator is selectively coupled to a corresponding tap point of a group of tap points located immediately below a coarse-resolution tap point coupled to a highest coarse-resolution comparator producing the first logic level to cause each fine-resolution comparator to produce a second logic level indicative of whether the input voltage ($V_{Qin}$) exceeds a voltage of the tap point coupled to the second input of that fine-resolution comparator. Output logic levels of the fine-resolution comparators and the coarse-resolution comparators up to and including the highest coarse-resolution comparator producing the first logic level together provide a thermometer code representation of the input voltage ($V_{Qin}$).

In one embodiment, the invention provides circuit for quantizing an analog input signal ($V_{Qin}$), including means for coupling a first input of each of a plurality of coarse-resolution comparators (21-3,7,11,15) to the input voltage ($V_{Qin}$) during a first phase time, wherein a second input of each coarse-resolution comparator is coupled to a plurality of corresponding coarse tap points, respectively, of a resistor string which also includes a plurality of intermediate tap points to cause each coarse-resolution comparator to produce a first logic level only if the input voltage ($V_{Qin}$) exceeds a voltage of the coarse-resolution tap point coupled to the first input of that course-resolution comparator, a plurality of fine-resolution comparators (24-1,2,3) each having a first input coupled to the input voltage ($V_{Qin}$), and means for selectively coupling a second input of each fine-resolution comparator to a corresponding tap point of a group of tap points located immediately below a coarse-resolution tap point coupled to a highest coarse-resolution comparator producing the first logic level to cause each fine-resolution comparator to produce a second logic level indicative of whether the input voltage ($V_{Qin}$) exceeds a voltage of the tap point coupled to the second input of that fine-resolution comparator during a second phase time which follows the first phase time. Output logic levels of the fine-resolution comparators and the coarse-resolution comparators up to and including the highest coarse-resolution comparator producing the first logic level together provide a thermometer code representation of the input voltage ($V_{Qin}$).

DETAILED DESCRIPTION OF THE PREFERRED EMBODIMENTS

Figure 3A:
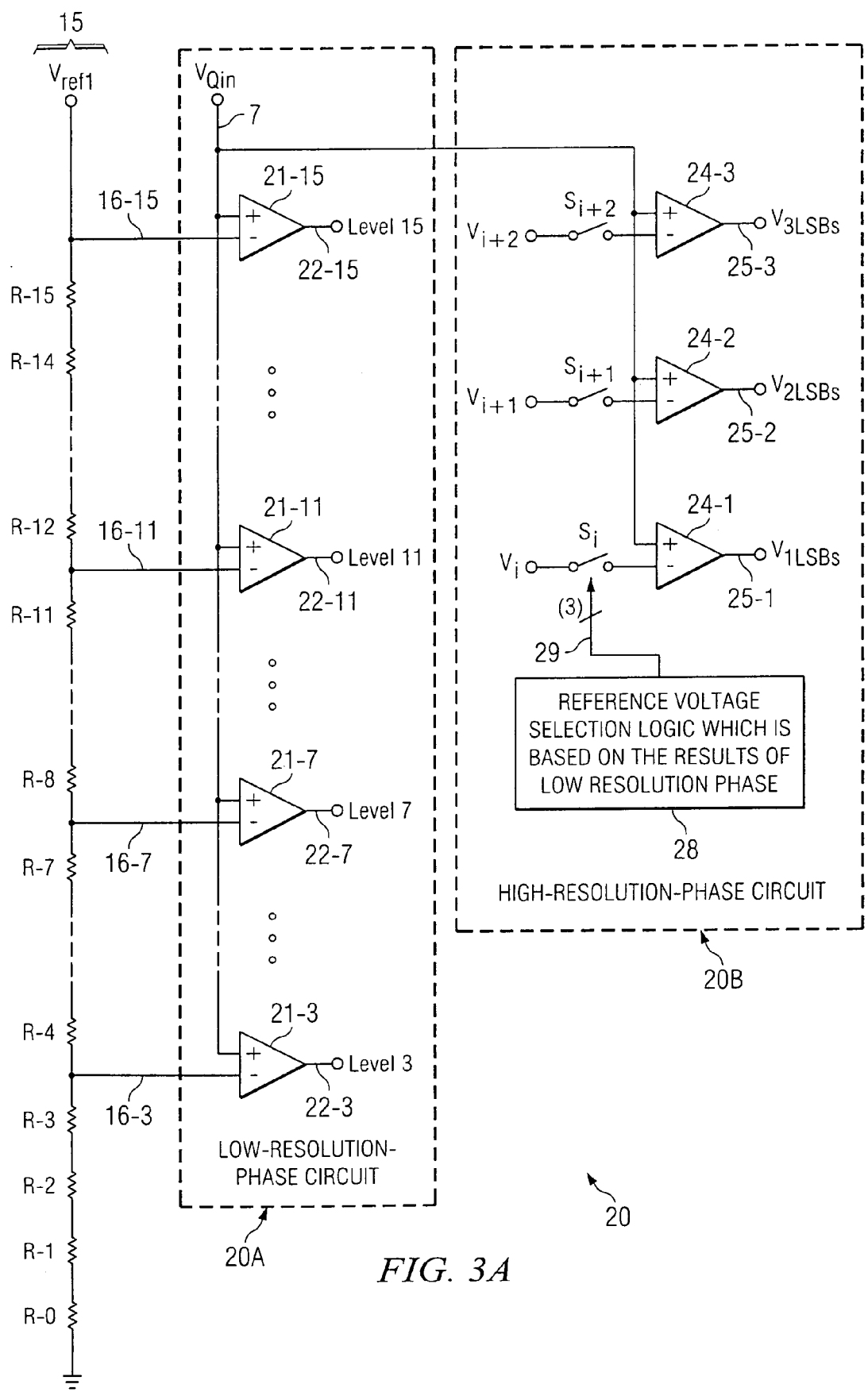
FIG. 3A is a block diagram of a digitally controlled two-phase multilevel quantizer according to the present invention.
Figure 4:
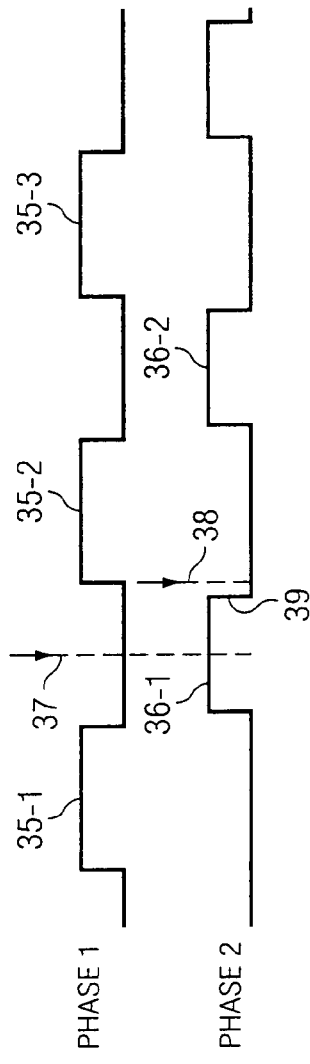
FIG. 4 is a timing diagram useful in describing the operation of the two-phase multilevel quantizer of FIG. 3A.

A generalized diagram of a 16-level quantizer according to the present invention and its timing diagram are shown in FIGS. 3A and 4, respectively. Referring to FIG. 3A, two-phase multilevel quantizer 20 includes a resistor string 15A, a low-resolution-phase circuit 20A, and a high-resolution-phase circuit 20B. Resistor string 15A includes, for example, 16 precision resistors R-0,1,2 . . . 15 coupled between a reference voltage $V_{ref1}$ and ground. Four of the tap points, labeled 16-3, 16-7, 16-11, and 16-15 are coupled to the (−) inputs of four comparators 21-3, 21-7, 21-11, and 21-15, respectively, of low-resolution-phase circuit 20A. Tap point 16-3 is connected to the junction between resistors R-3 and R-4. Similarly, tap point 16-7 is connected to the junction between string resistors R-7 and R-8, tap point 16-11 is connected to the junction between string resistors R-11 and R-12, and tap point 16-15 is connected to $V_{ref1}$.

The (+) inputs of comparators 21-3, 21-7, 21-11, and 21-15 are connected by conductor 7 to receive an input signal, $V_{Qin}$ for example, from the loop filter 6A of subsequently described FIG. 5. Four output voltages Level 3, Level 7, Level 11, and Level 15 are produced on the outputs 22-3, 22-7, 22-11, and 22-15 of comparators 21-3, 21-7, 21-11, and 21-15, respectively. The voltage Level 3 is 3 LSB voltage drops above ground, the voltage Level 7 is 7 LSB voltage drops above ground, the voltage Level 11 is 11 LSB voltage drops above ground, and the voltage Level 15 is 15 LSB voltage drops above ground. One LSB voltage drop is equal to $V_{ref1}$ divided by the number of equal resistors (i.e., $2^4=16$ resistors, in this example).

High-resolution-phase circuit 20B includes, for example, three comparators 24-1, 24-2, and 24-3 having their (+) inputs connected to receive the analog input signal $V_{Qin}$. The (−) input of comparator 24-1 is connected to one terminal of a switch $S_i$, the other terminal of which is connected to receive a selectable reference voltage $V_i$. Similarly, the (−) input of comparator 24-2 is connected to one terminal of a switch $S_{i+1}$, the other terminal of which is connected to receive a selectable reference voltage $V_{i+1}$, and the (−) input of comparator 24-3 is connected to one terminal of a switch $S_{i+2}$, the other terminal of which is connected to receive a selectable reference voltage $V_{i+2}$. The switches $S_i$, $S_{i+1}$, and $S_{i+2}$ and the corresponding selectable reference voltages $V_i$, $V_{i+1}$, and $V_{i+2}$ are selected by reference voltage selection logic circuit 28, which controls the states of switches $S_i$, $S_{i+1}$, and $S_{i+2}$ and also controls the selected values of reference voltages $V_i$, $V_{i+1}$ and $V_{i+2}$, all on the basis of the results of the output produced by low-resolution-phase circuit 20A. High-resolution-phase circuit 20B produces the high-resolution output voltages $V_{1LSB}$, $V_{2LSB}$, and $V_{3LSB}$ on the output conductors 25-1, 25-2, and 25-3 of comparators 24-1, 24-2, and 24-3, respectively.

Thus, quantizer 20 is composed of a low-resolution-phase circuit 20A and a high-resolution phase circuit 20B, wherein during Phase 1, quantizer 20A determines or quantizes a coarse range value of its input signal $V_{Qin}$. During phase 2, more accurate quantization is provided by means of high-resolution-phase circuit 20B.

Figure 3B:
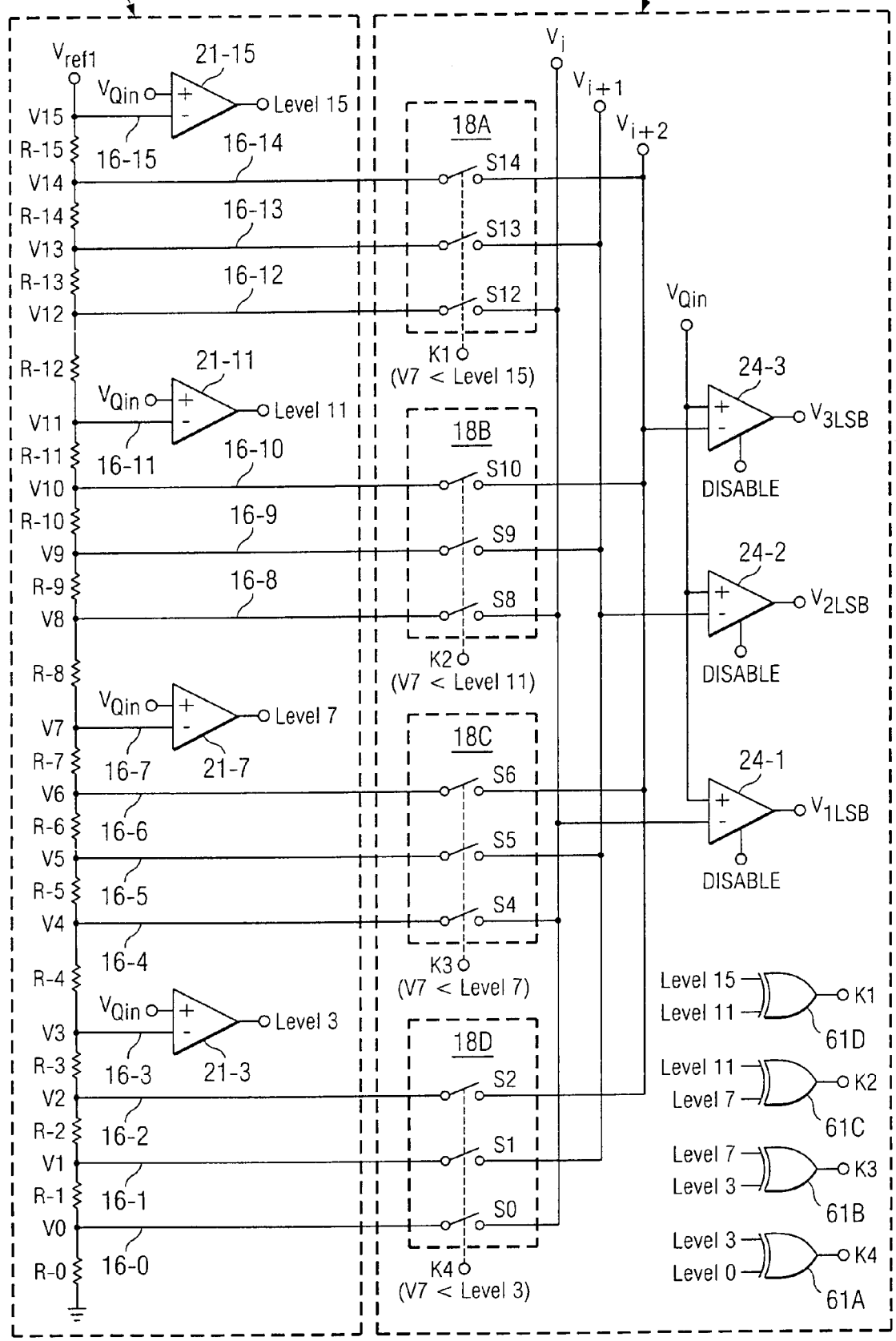
FIG. 3B is a more detailed schematic diagram of part of the digitally controlled two-phase multilevel quantizer of FIG. 3A.
Figure 3C:
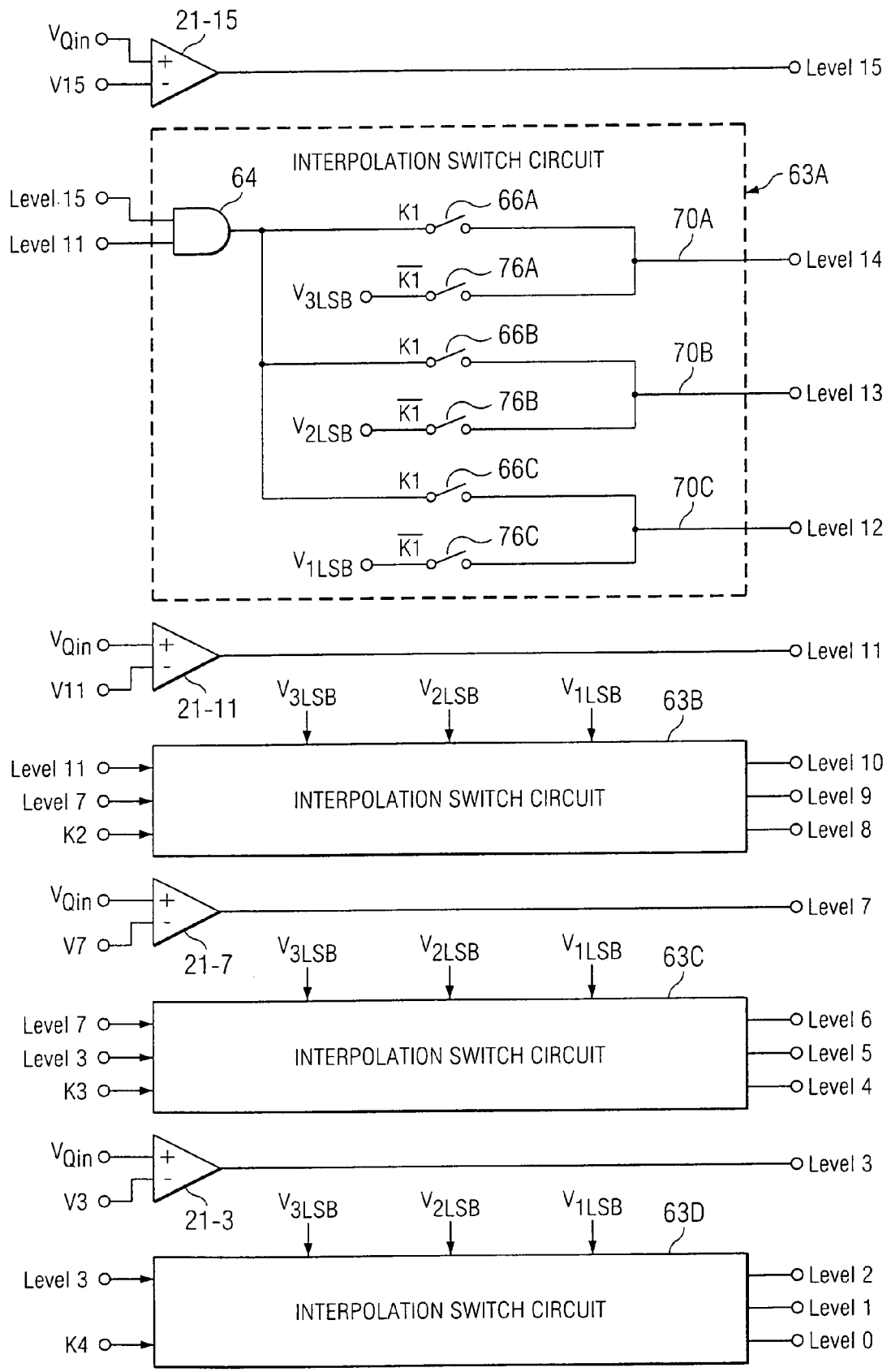
FIG. 3C is a more detailed schematic diagram of another part of the digitally controlled two-phase multilevel quantizer of FIG. 3A.

FIGS. 3B and 3C together show a more detailed diagram of quantizer 20 of FIG. 3A. Referring to FIG. 3B, low-resolution-phase circuit 20A is the same as shown in FIG. 3A, except that the resistive divider tap voltages V0,1,2 . . . 15 on conductors 16-0,1 . . . 15, respectively, are shown, with tap voltage V15 being the same as reference voltage $V_{ref1}$.

In high-resolution-phase circuit 20B, tap voltages V0, V1, and V2 are connected to a first terminal of each of switches S0, S1, and S2, respectively of switch group 18D and a second terminal of each of switches S0, S1, and S2 is connected to the (−) input of fine-resolution comparators 24-1, 24-2, and 24-3, respectively. (Note that switches S0, S1 and S2 in FIG. 3B perform the functions of switches $S_i$, $S_{i+1}$, and $S_{i+2}$ in FIG. 3A.) Similarly, tap voltages V4, V5, and V6 are connected to a first terminal of each of switches S4, S5, and S6, respectively of switch group 18C and second terminals of switches S4, S5, and S6 are connected to the (−) inputs of fine-resolution comparators 24-1, 24-2, and 24-3, respectively, and switches S4, S5 and S6 in FIG. 3B perform the functions of switches $S_i$, $S_{i+1}$, and $S_{i+2}$ in FIG. 3A, and so on. Tap voltages V8, V9, and V10 are connected to first terminals of switches S8, S9, and S10, respectively of switch group 18B and second terminals of switches S8, S9, and S10 are connected to the (−) inputs of fine-resolution comparators 24-1, 24-2, and 24-3, respectively, and tap voltages V12, V13, and V14 are connected to first terminals of switches S12, S13, and S14, respectively of switch group 18A and second terminals of switches S12, S13, and S14 are connected to the (−) inputs of fine-resolution comparators 24-1, 24-2, and 24-3, respectively. The (+) inputs and the outputs of high-resolution comparators 24-1, 24-2, and 24-3 are connected to $V_{Qin}$ as shown in FIG. 3C.

High-resolution-phase 20B also includes 4 exclusive NOR gates 61A,B,C,D. The inputs of exclusive NOR gate 61D are connected to receive the voltages Level 15 and Level 11, and its output produces the signal K1. Similarly, the inputs of exclusive NOR gate 61C are connected to receive the voltages Level 11 and Level 7, and its output produces the signal K2; the inputs of exclusive NOR gate 61B are connected to receive the voltages Level 7 and Level 3, and its output produces the signal K3; the inputs of exclusive NOR gate 61A are connected to receive the voltages Level 3 and Level 0, and its output produces the signal K4. The signals K1, K2, K3, and K4 are coupled to the control terminals of the switches in switch groups 18A, 18B, 18C, and 18D, respectively.

A signal DISABLE may be coupled to a disable input of each of fine-resolution comparators 24-1, 24-2 and 24-3. The signal DISABLE can be used, if desired, to turn off $V_{1LSB}$, $V_{2LSB}$, and $V_{3LSB}$. However, this will reduce both the power consumption and the resolution of quantizer 20.

FIG. 3C shows 4 interpolation circuits 63A,B,C,D which are included in high-resolution-phase quantization circuit 20B, and also shows low-resolution comparators 21-3, 21-7, 21-11 and 21-15 in order to show all 16 output quantization voltage levels Level 0,1 . . . 15 of multilevel quantizer 20.

Referring to FIG. 3C, interpolation circuit 63A includes an AND gate 64, the inputs of which receive the logic signals Level 15 and Level 11, respectively. The output of AND gate 64 is connected to one terminal of each of switches 66A, 66B and 66C, each of which has a control terminal coupled to receive the above mentioned exclusive NOR output signal K1. The other terminal of each of switches 66A, 66B and 66C is connected to conductors 70A, 70B and 70C, respectively. Switches 76A, 76B, and 76C each have one terminal connected to conductors 70A, 70B, and 70C, respectively. Switches 76A, 76B, and 76C are controlled by the logical complement of K1, and each also has another terminal connected to receive the output signals $V_{3LSB}$, $V_{2LSB}$, and $V_{1LSB}$ from the outputs of fine-resolution comparators 24-1, 24-2, and 24-3, respectively. Interpolation switch circuit 63A produces the logic signals Level 14, Level 13 and Level 12 on conductors 70A, 70B and 70C, respectively.

Interpolation switch circuit 63B is similar, except that the inputs of its AND gate receive Level 11 and Level 7, its internal switches are responsive to the signal K2 produced by exclusive OR gate 61C, and it produces the logic signals Level 10, Level 9, and Level 8. Interpolation switch circuit 63C also is similar, except that the inputs of its AND gate receive Level 7 and Level 3, its internal switches are responsive to the signal K3 produced by exclusive OR gate 61B, and it produces the logic signals Level 6, Level 5, and Level 4. Interpolation switch circuit 63D also is similar, except its receives Level 3, its internal switches are responsive to the signal K4 produced by exclusive OR gate 61A, and it produces the logic signals Level 2, Level 1, and Level 0. In interpolation switch circuit 63D, the AND gate is replaced by an inverter.

During the low-resolution phase, if any of the low-resolution adjacent comparator output levels are the same, then comparison operations on intermediate tap point voltage levels located between them are not necessary, and those intermediate tap point voltage levels are "interpolated" by simple digital logic circuits.

Tap points of resistor string 15 which are coupled to the (−) inputs of low-resolution phase comparators 21-3, 7, 11, 15 are fixed, while the tap points coupled to the (−) inputs of high-resolution comparators 24-1,2,3 are, in effect, "slid" up or down along resistor string 15 based on the results of the low-resolution-phase comparison operation. For an ADC using quantizer 20, the low-resolution quantization operation occurs in the middle of the integration phase. In a stand-alone flash ADC, the arrangement creates a "time slot" in which to switch in the proper reference voltages for high-resolution comparators 24-1,2,3 for the high-resolution quantization phase. This approach divides the quantization operation into two phases, which effectively increases the settling time for any comparison glitch voltages which occur prior to the critical sampling clock edges 39 shown in FIG. 4. Dashed line 37 in FIG. 4 refers to the timing when coarse comparison begins, while dashed line 38 refers to the timing when fine comparison begins. These clock edges are independent of quantizer design. Comparators are normally composed of analog latches. Comparison operation begins when the latch is released. The low-resolution phase comparators 21-3,7,11,15 also set up the initial DC operational points for the delta sigma loop when a 32-level implementation of quantizer 20 is used in the delta sigma modulator architecture of subsequently described FIG. 5. This is important because when ADC 40 begins to operate, Vin can have any value, including values greater than Level 15 or less than Level 3. In any case, quantizer 20 must immediately track Vin in order to avoid oscillation and provide stable operation.

If Level 3 and Level 7 are at a "1" level, that means the input voltage $V_{Qin}$ must be greater than Level 7. That means it is not necessary for fine-resolution comparators 24-1,2,3 to operate between coarse Level 3 and coarse Level 7 and between Level 0 and coarse level 3 for the coarse-level quantizations. If in this example Level 11 is "0", that means the input voltage is between Level 7 and Level 11. A simple exclusive NOR gate operates to close switches S8, S9 and S10 to couple the (−) inputs of the 3 fine resolution comparators 24-1,2,3 to tap point Level 8, Level 9 and Level 10, respectively.

For example, if Level 3 and Level 7 both are "1"s, then intermediate tap point Levels 4, 5, and 6 will be "1"s, and the outputs of corresponding interpolation circuits 63A-D in FIG. 3C will be "1"s. Coarse comparisons of $V_{Qin}$ to the fixed point voltages on conductors 16-3,7,11,15 are made by means of coarse comparators 21-3, 7,11,15 during Phase 1. Based on the result, which, for example, shows that Level 11 is low and Level 7 is high, it follows that the input voltage $V_{Qin}$ must be between Level 7 and Level 11. Therefore, switches S8, S9, S10 are closed by exclusive NOR gate 61C in order to compare $V_{Qin}$ with those levels by means of fine resolution comparators 24-1,2,3. (By way of definition, is to be understood that an exclusive OR function is the basic function performed by either an exclusive OR gate or an exclusive NOR gate. Similarly, it should be understood that a logical OR function is the basic function performed by either an OR gate or a NOR gate. Similarly, it should be understood that a logical AND or ANDing function is the basic function performed by either an AND gate or a NAND gate.) Also, if Level 7 and Level 11 both are "0"s instead of both "1"s, it is not necessary compare the intermediate tap point voltage Levels 8, 9, and 10 and control the switches S8, S9, and S10 by means of exclusive NOR gate 61C.

Thus, the outputs of adjacent coarse comparators are considered to be exclusive ORed by means of NOR gates 61A, B,C,D to determine whether or not to turn on the fine resolution stage switches between coarse comparators 24-1,2,3. If the 2 adjacent coarse comparator outputs are equal, there is no need to compare the intermediate tap voltage levels between them with input voltage $V_{Qin}$, so the corresponding switches coupling them to the inputs of fine-resolution comparators 24-1,2,3 remain open, so if the input voltage $V_{Qin}$ is equal to any of the coarse levels Level 3, 7, 11, or 15, then fine-resolution comparators 24-1,2,3 can be turned off.

No analog domain addition or subtraction operation is involved in the quantization process. The digital output produced during Phase 1 determines the comparison range to be more accurately determined during Phase 2. The outputs of both the Phase 1 and Phase 2 operations "track" the level of input signal $V_{Qin}$. If the comparator output voltages of adjacent low-resolution-phase circuit 20A are the same (i.e., both are "high" or both are "low"), this means that the input voltage $V_{Qin}$ is not within the voltage range between those two comparator output voltages. Therefore, further quantization or high-resolution comparison is not needed between the two comparator output voltages. The output bits between low-resolution bits in low-resolution-phase circuit 20A can be "interpolated" by the simple interpolation circuits shown in FIG. 3C.

In the low-resolution phase, quantizer 20 makes a coarse determination of the range within which the input signal $V_{Qin}$ lies by means of low-resolution-phase circuit 20A, and makes a more accurate quantization of $V_{Qin}$ during the high-resolution phase by operation of the high-resolution-phase circuit 20B. For the present example of a 16 level quantizer, the low-resolution-phase circuit 20A is implemented by means of only 4 comparators 21-1,2,3,4,5, and the high-resolution-phase is implemented by means of the 3 comparators 24-1,2,3.

Figure 1:
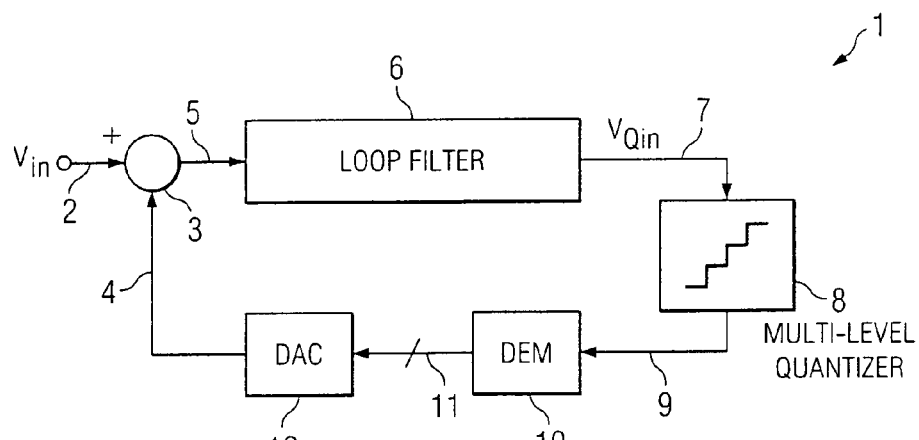
FIG. 1 is a block diagram of a conventional delta-sigma ADC.
Figure 2:
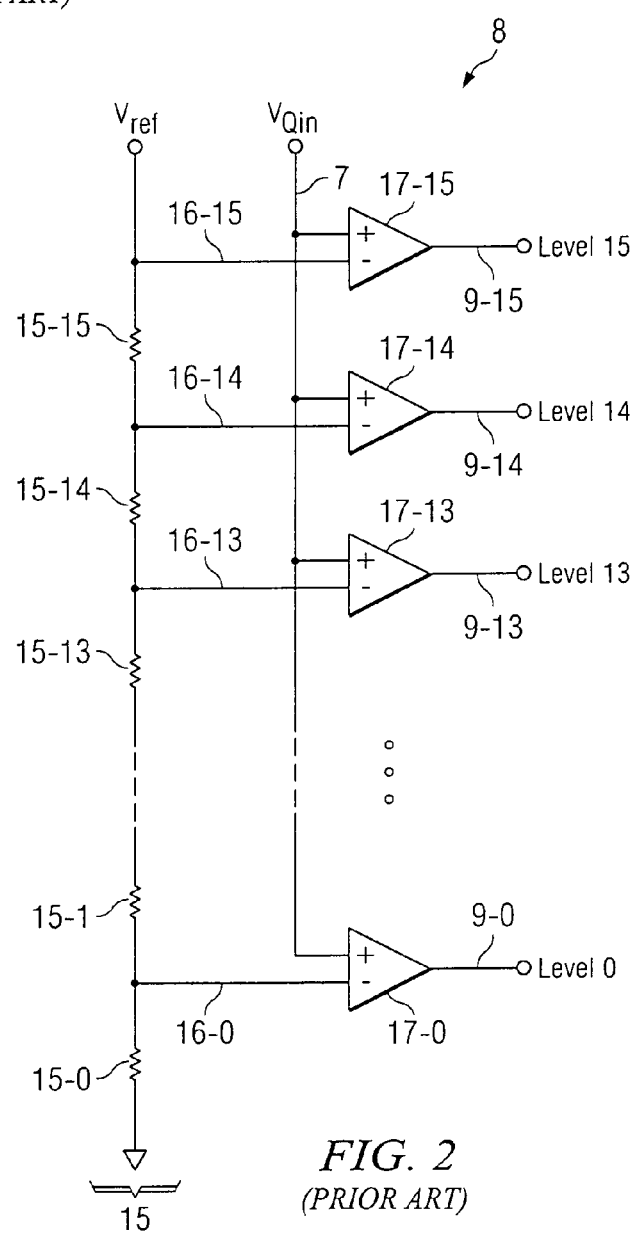
FIG. 2 is a block diagram of a conventional flash type quantizer used in the delta-sigma ADC of FIG. 1.

During the low-resolution phase, if both of a the adjacent comparator outputs are "high", for example, if both Level 7 and Level 11 are "high", this indicates that the input signal $V_{Qin}$ is greater than Level 11. In this case, the outputs for Level 8 to Level 10 also must be "high", so the comparators which produce the voltages Level 8 to Level 10 need not operate. Similar results are obtained for the case when adjacent comparator outputs are "low", so the three high-resolution-phase comparators need operate only when the adjacent low-resolution comparator output states are different. For example, if the Level 7 output is "high" and the Level 11 output is "low", this indicates the input signal $V_{Qin}$ is between Level 7 and Level 11. The high-resolution comparator input signal $V_{Qin}$ will be connected to appropriate values of reference voltages $V_{ref2}$, $V_{ref3}$, and $V_{ref4}$ for Level 8 to Level 10 in order to generate values of $V_{1LSB}$, $V_{2LSB}$ and $V_{3LSB}$ so as to provide a high-resolution output which accurately represents the value of $V_{Qin}$ without requiring all 16 comparators as in Prior Art FIG. 1 and their associated power dissipation. Instead of 16 comparators, the foregoing scheme reduces the number to only 7.

Figure 5:
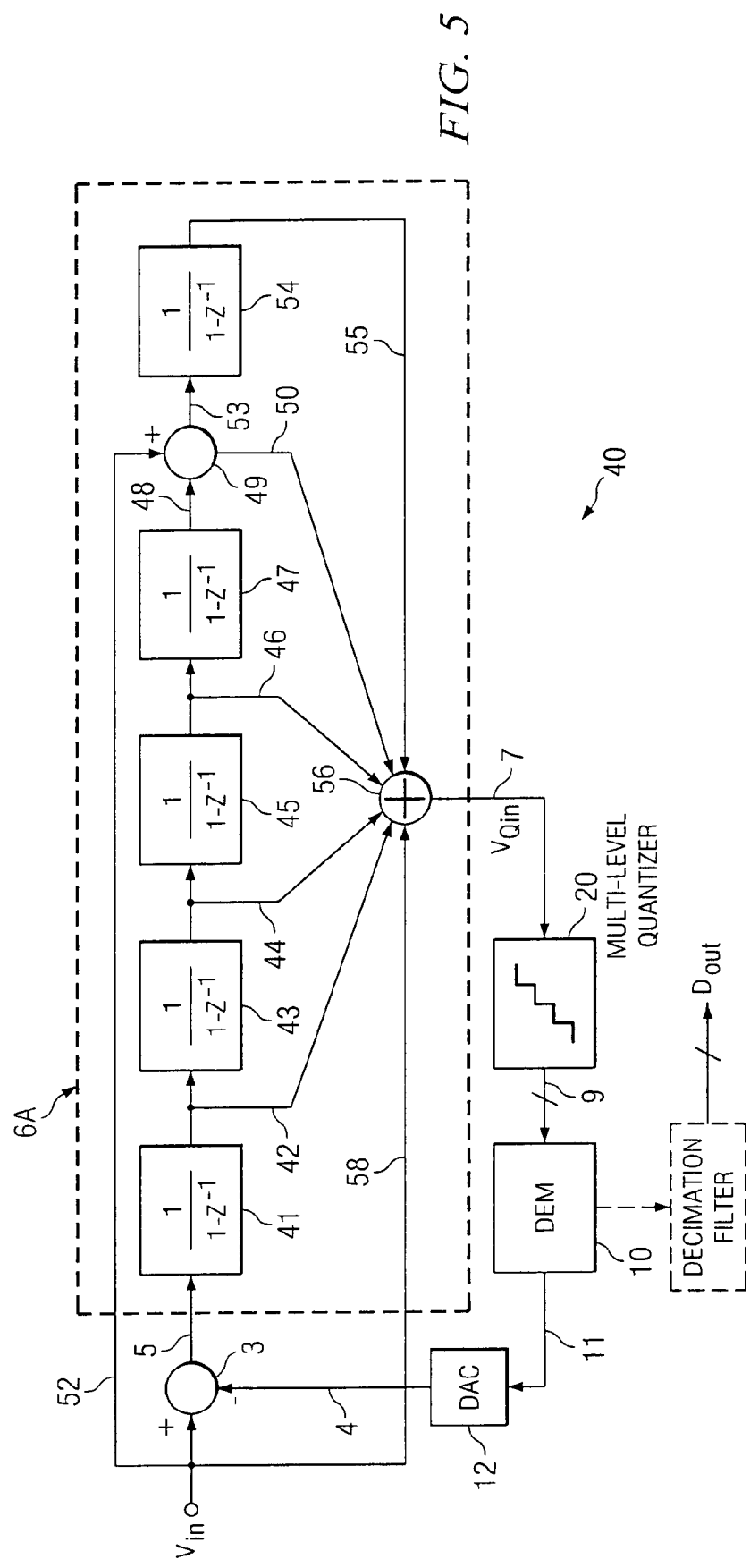
FIG. 5 is a block diagram of a single loop delta-sigma modulator utilizing the two-phase multilevel quantizer of FIG. 3A.

FIG. 4 shows the timing of the operation of low-resolution-phase circuit 20A and high-resolution-phase circuit 20B in conjunction with integration operation of the delta-sigma modulator 40 shown in FIG. 5. As shown in FIG. 4, time of occurrence of the low-resolution quantization can be made to occur substantially earlier than the critical sampling clock edges 39 in order to minimize noise coupling.

Referring next to FIG. 5, single loop delta-sigma modulator 40 includes a loop filter 6A which receives via conductor 5 the summation output produced by analog summing element 3. The (+) input of analog summing element 3 receives analog input voltage Vin, and the (−) input of summing element 3 receives a negative feedback voltage on conductor 4. The output signal $V_{Qin}$ produced by loop filter 6A is applied to the input of two-phase multilevel quantizer 20 shown in FIG. 3A described above. The output 9 of two-phase multilevel quantizer 20 is applied to an input of DEM circuit 10, the output 11 of which is connected to the digital input of DAC 12, the output of which provides the above-mentioned negative feedback signal on conductor 4. Like all DEMs, DEM 10 uses a conventional thermometer code output, which is what is produced by multilevel quantizer 20.

Loop filter 6A includes conventional integrators 41, 43, 45, 47, and 54. The output of integrator 41 is connected by conductor 42 to the input of integrator 43 and to one input of a summing element 56. Similarly, the output of integrator 43 is connected by conductor 44 to the input of integrator 45 and to one input of summing element 56, and the output of integrator 45 is connected by conductor 46 to the input of integrator 47 and to one input of summing element 56. The output of integrator 47 is connected by conductor 48 to one input of a summing element 49. Another input of summing element 49 is connected by conductor 52 to receive a feed-forward signal from Vin. One output of summing element 49 is connected by conductor 53 to the input of integrator 54, the output of which is connected by conductor 55 to another input of summing element 56. Another output of summing element 49 is connected by conductor 50 to another input of summing element 56. Another input of summing element 56 is connected to receive another feed-forward signal from Vin via conductor 58. The output 7 of summing element 56 conducts the signal $V_{Qin}$ to the input of two-phase multilevel quantizer 20.

During oversampling delta-sigma modulator operation, techniques such as signal feed-forward, shown in FIG. 5, ensure that the quantizer output varies at most by 2 LSB voltage levels each time. This technique can be used to further optimize the multilevel quantizer design. For example, if the signal Level 9 is "high" during the high-resolution phase, it can be safely "predicted" that the next quantizer output will be bounded by Level 11 (i.e., Level 9+2) to Level 7 (i.e., Level 9−2). During the next delta-sigma operation, only the comparators that produce Level 7 and Level 11 will be turned on, and all other low-resolution comparators may be turned off while their outputs continue to present their previous values. If Level 8 is "high", only course-resolution comparators for Level 7 will be turned on during the next clock phase since the next quantizer output will be bounded by Level 10 and Level 6. The same principle applies to Level 10. In this scheme, course-resolution comparators, which are on during a start-up sequence, set up the initial operational point for quantizer 20 and delta-sigma modulator 40. During steady operation mode, only 2 course-resolution comparators at most are turned on. This greatly reduces the overall power consumption, and greatly reduces the amount of noise current injected into the substrate.

A decimation filter as shown in dashed lines can be added to FIG. 5 to provide a delta-sigma ADC.

The delta-sigma analog modulator shown in FIG. 5 is a modified fifth order feed-forward modulator with 33 quantization levels, using a 32-level implementation of quantizer 20, which for simplicity is shown in FIGS. 3A and 3B as a 16-level quantizer. Input signal feed forward paths are added to the last downstream integrator and multi-level quantizer. This approach minimizes signal energy leakage into the delta-sigma loop. Compared with existing signal feed forward structures, this approach limits the output swings of all of the integrators with a minimum increase of system and circuit level complexity, and also helps to improve modulator stability and prevent overload conditions for full scale input signals.

By way of definition, the term "conversion circuit" is considered herein to encompass a variety of circuits that convert an analog signal to a digital circuit or vice versa, including an ADC, a DAC, and a multi-phase quantizer as shown in FIGS. 3A-C. The two-phase quantizer shown in these drawings can be utilized in some of the same applications as a conventional flash ADC.

Compared with tranditional flash ADCs, the above described scheme reduces area and also reduce power and therefore also reduce the amount of signal-dependent noise injected into the integrated circuit substrate. The present invention is based on digital domain operation, so no analog addition or subtraction is needed. This extends its potential to be used further in sub-micron digital process. (That is, the above described scheme requires additional logic circuitry, but does not require any additional analog circuits such as DACs. In sub-micron digital manufacturing processes, process parameters such as the MOS threshold voltage Vt and carrier mobilities vary with particular process designs, temperature, etc. This makes it more difficult to maintain highly accurate performance of analog circuits manufactured using sub-micron digital processes.)

Since the quantization occurs in both the coarse-quantization stage and fine-quantization stage, the operation of the high-resolution-phase circuitry 20B can be turned off to save power.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. Although, a 16 level quantizer is described for simplicity, the same architecture can be used for a 32 level (or higher level) quantizer.

What is claimed is:

1. A conversion circuit comprising:
   (a) a coarse-resolution quantization circuit including
      i. a resistor string including a plurality of resistors and a plurality of tap points between the various resistors, and
      ii. a plurality of coarse-resolution comparators, each coarse-resolution comparator having a first input coupled to receive an input voltage and a second input coupled to a corresponding coarse-resolution tap point, each coarse-resolution comparator being operable during a first phase to produce a first logic level only if the input voltage exceeds a voltage of the coarse-resolution tap point coupled to the second input of that coarse-resolution comparator; and
   (b) a fine-resolution quantization circuit including
      i. a plurality of fine-resolution comparators each having a first input coupled to receive the input voltage, each fine-resolution comparator being operable during a second phase to produce a fine-resolution output logic level indicative of whether the input voltage exceeds a voltage of a tap point coupled to a second input of that fine-resolution comparator, and
      ii. a control circuit operative to selectively couple the second input of each fine-resolution comparator to a corresponding tap point of a group of tap points located immediately below a coarse-resolution tap point coupled to a highest coarse-resolution comparator producing the first logic level, the output logic levels of the fine-resolution comparators and the coarse-resolution comparators up to and including the highest coarse-resolution comparator producing the first logic level representing a thermometer code representation of a quantized value of the input voltage.

2. The conversion circuit of claim 1 wherein a group of tap points is located immediately below each coarse-resolution tap point, respectively, wherein the control circuit includes a plurality of groups of switches, each group of switches corresponding to a group of the tap points, respectively, wherein in each group of switches a first terminal of each switch is coupled to a corresponding tap point and a second terminal of that switch is coupled to the second input of a corresponding fine-resolution comparator, respectively.

3. The conversion circuit of claim 2 wherein the control circuit includes a plurality of exclusive OR circuits, each exclusive OR circuit having a pair of inputs coupled to outputs of a pair of adjacent coarse-resolution comparators, respectively, to determine if output logic levels thereof are equal, an output of each exclusive OR circuit being coupled to control electrodes of the switches of a corresponding group, respectively, to close the switches in that group when the output logic levels of the adjacent coarse-resolution comparators are different.

4. The conversion circuit of claim 3 further including a plurality of interpolation circuits each having a first pair of inputs coupled to outputs of a pair of adjacent coarse-resolution comparators, respectively, each interpolation circuit being coupled to the output of a corresponding exclusive OR circuit, respectively, to produce a plurality of interpolation quantization levels between quantization levels represented by the outputs of a corresponding pair of adjacent coarse-resolution comparators.

5. The conversion circuit of claim 3 wherein each exclusive OR circuit includes an exclusive NOR gate.

6. The conversion circuit of claim 4 wherein each fine-resolution comparator has a disable input for reducing power consumption therein.

7. The conversion circuit of claim 4 wherein each interpolation circuit includes
   (1) an AND function circuit for performing a logical ANDing of the output levels of a corresponding pair of adjacent coarse-resolution comparators; and
   (2) a plurality of switch circuits each including
      i. a first switch coupled between an output of the AND function circuit and a corresponding quantization level conductor,
      ii. a second switch coupled between an output of a corresponding fine-resolution comparator and the corresponding quantization level conductor, and
      iii. the first switch being operable to couple a logic level equal to the first logic level to the corresponding quantization level conductor when output levels of the corresponding pair of adjacent coarse-resolution quantization circuits are equal, the second switch being operable to couple the output of the corresponding fine-resolution comparator to the corresponding quantization level conductor when the output levels of the corresponding pair of adjacent coarse-resolution quantization circuits are different.

8. The conversion circuit of claim 7 wherein all of the logic levels produced by the coarse-resolution comparators and the fine-resolution comparators together constitute the thermometer code representation of the input voltage.

9. The conversion circuit of claim 1 further, including a delta-sigma modulator, and wherein the coarse-resolution quantization circuit and the fine-resolution quantization circuit are included as a two-phase quantizer of the delta-sigma modulator.

10. The conversion circuit of claim 9 further including a decimation filter coupled to an output of the two-phase quantizer such that the conversion circuit is a delta-sigma ADC.

11. The conversion circuit of claim 1 wherein the number of tap points of each group is equal to the number of fine-resolution comparators.

12. The conversion circuit of claim 7 wherein the first logic level is a logical "1" level.

13. The conversion circuit of claim 1 further including 4 of the course-resolution comparators and 3 of the fine-resolution comparators.

14. The conversion circuit of claim 4 wherein on all of the course-resolution comparators provide an immediate initial DC operational point for the course-resolution quantization circuit during start-up operation.

15. The conversion circuit of claim 9 wherein the delta sigma modulator is a fifth order feed-forward delta-sigma modulator.

16. A method of quantizing an analog input signal, comprising:
   (a) during a first phase time, coupling a first input of each of a plurality of coarse-resolution comparators to the input voltage, wherein a second input of each coarse-resolution comparator is coupled to a plurality of corresponding coarse tap points, respectively, of a resistor string which also includes a plurality of intermediate tap points to cause each coarse-resolution comparator to produce a first logic level only if the input voltage exceeds a voltage of the coarse-resolution tap point coupled to the first input of that course-resolution comparator; and
   (b) during a second phase time which follows the first phase time,
      i. coupling a first input of each of a plurality of fine-resolution comparators to the input voltage, and
      ii. selectively coupling a second input of each fine-resolution comparator to a corresponding tap point of a group of tap points located immediately below a coarse-resolution tap point coupled to a highest coarse-resolution comparator producing the first logic level to cause each fine-resolution comparator to produce a second logic level indicative of whether the input voltage exceeds a voltage of the tap point coupled to the second input of that fine-resolution comparator,
   wherein output logic levels of the fine-resolution comparators and the coarse-resolution comparators up to and including the highest coarse-resolution comparator producing the first logic level together represent a thermometer code representation of the input voltage.

17. A circuit for quantizing an analog input signal, comprising:
   (a) means for coupling a first input of each of a plurality of coarse-resolution comparators to the input voltage during a first phase time, wherein a second input of each coarse-resolution comparator is coupled to a plurality of corresponding coarse tap points, respectively, of a resistor string which also includes a plurality of intermediate tap points to cause each coarse-resolution comparator to produce a first logic level only if the input voltage exceeds a voltage of the coarse-resolution tap point coupled to the first input of that course-resolution comparator;
   (b) a plurality of fine-resolution comparators each having a first input coupled to the input voltage; and
   (c) means for selectively coupling a second input of each fine-resolution comparator to a corresponding tap point of a group of tap points located immediately below a coarse-resolution tap point coupled to a highest coarse-resolution comparator producing the first logic level to cause each fine-resolution comparator to produce a second logic level indicative of whether the input voltage exceeds a voltage of the tap point coupled to the second input of that fine-resolution comparator during a second phase time which follows the first phase time,
      wherein output logic levels of the fine-resolution comparators and the coarse-resolution comparators up to and including the highest coarse-resolution comparator producing the first logic level together represent a thermometer code representation of the input voltage.

* * * * *